(12) United States Patent
Marotta et al.

(10) Patent No.: US 6,687,161 B2
(45) Date of Patent: Feb. 3, 2004

(54) SENSING SCHEME FOR LOW-VOLTAGE FLASH MEMORY

(75) Inventors: Giulio G. Marotta, Contigliano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 10/036,751

(22) Filed: Dec. 21, 2001

(65) Prior Publication Data

US 2002/0172076 A1 Nov. 21, 2002

(30) Foreign Application Priority Data

Jan. 3, 2001 (IT) .................................... RM2001A0001

(51) Int. Cl.[7] .............................................. G11C 16/06
(52) U.S. Cl. .............................. 365/185.21; 365/185.2; 365/185.25
(58) Field of Search .................... 365/185.2, 185.21, 365/185.25

(56) References Cited

U.S. PATENT DOCUMENTS

| | | |
|---|---|---|
| 4,727,519 A | 2/1988 | Morton et al. |
| 4,763,026 A | 8/1988 | Tsen et al. |
| 5,625,588 A | 4/1997 | Seyyedy et al. |
| 5,949,728 A | 9/1999 | Liu et al. |
| 5,999,439 A | 12/1999 | Seyyedy |
| 6,128,226 A | 10/2000 | Eitan et al. |
| 6,288,944 B1 * | 9/2001 | Kawamura ............. 365/185.22 |
| 6,301,175 B1 | 10/2001 | Seyyedy et al. |
| 6,411,550 B1 | 6/2002 | Nasu |
| 6,535,026 B2 * | 3/2003 | Chung et al. .................. 327/51 |
| 2002/0008549 A1 | 1/2002 | Forbes |

* cited by examiner

Primary Examiner—Michael S. Lebentritt
Assistant Examiner—Tuan T. Nguyen
(74) Attorney, Agent, or Firm—Leffert Jay & Polglaze, P.A.; Thomas W. Leffert

(57) ABSTRACT

Single-ended sensing devices for sensing a programmed state of a floating-gate memory cell are adapted for use in low-voltage memory devices. The sensing device has an input node selectively coupled to the memory cell. The sensing device includes a precharging path for applying a precharge potential to the input node of the sensing device for precharging bit lines prior to sensing the programmed state of the memory cell, and a reference current path for applying a reference current to the input node of the sensing device. The sensing device still further includes a sense inverter having an input coupled to the input node of the sensing device and an output for providing an output signal indicative of the programmed state of the memory cell. The reference current is applied to the input node of the sensing device during sensing of the programmed state of the memory cell.

39 Claims, 6 Drawing Sheets

SENSING SCHEME FOR LOW-VOLTAGE FLASH MEMORY

STATEMENT OF RELATED APPLICATIONS

This application claims priority to Italian Patent Application Serial No. RM2001A000001 filed Jan. 3, 2001, which is commonly assigned.

TECHNICAL FIELD OF THE INVENTION

The present invention relates generally to semiconductor memory devices, and in particular, the present invention relates to sensing schemes in a low-voltage semiconductor flash memory device.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and power demands. Portable applications such as digital cameras, audio recorders, personal digital assistants (PDAs) and test equipment also use flash memory as a medium to store data.

To achieve lower operating voltages and lower power demands, operation of the memory device must generally come under tighter constraints. Lower operating margins increase the demands on sensing circuits and related circuits for accessing a memory cell and sensing the data contained therein. For example, sensing devices in flash memory devices often rely on a voltage differential to determine the programmed state of a memory cell, such as a voltage differential between a target bit line and a reference voltage. As operating voltages are reduced, such differential sensing devices often must be capable of distinguishing between smaller voltage differentials. At lower voltages, differential sensing becomes slower and, at very low voltages, may even become unreliable.

Read Only Memory (ROM) devices often utilize a single-ended sensing scheme as opposed to differential sensing. A single-ended sensing device has a single input coupled to a target bit line and provides an output signal indicative of a potential level of the target bit line. In operation, the target bit line is precharged to some precharge potential. During or after precharging, the word line of the target memory cell is driven. Upon release from the precharge potential, the logic state of the target memory cell is sensed. If the potential level of the target bit line remains unchanged, it is indicative of no current flow through the target memory cell, thus corresponding to a first logic state. If the potential level of the target bit line falls, it is indicative of current flow through the target memory cell, thus corresponding to a second logic state.

The single-ended sensing device often contains an inverter providing the output signal indicative of the logic state and having a threshold point close to the precharge potential. Choosing a threshold point close to the precharge potential improves the speed of the sensing device by reducing the time necessary to detect the second logic state. Choosing a threshold point close to the precharge potential also improves the power usage of the sensing device by reducing the amount of current necessary to precharge the bit line for the next read cycle. However, choosing a threshold point close to the precharge potential risks erroneous indications of the second logic state if undesired, or residual, current flow is experienced. Such risks have hindered use of single-ended sensing in high-performance flash memory devices, which often experience some residual current due to depletion, leakage, insufficient programming or other phenomena, yet must often perform at lower operating voltages and lower power requirements.

For the reasons stated above, and for other reasons stated below which will become apparent to those skilled in the art upon reading and understanding the present specification, there is a need in the art for alternative sensing devices for integrated-circuit memory devices, memory devices containing such sensing devices, and methods of their operation.

SUMMARY OF THE INVENTION

The above-mentioned problems with memory devices and other problems are addressed by the present invention and will be understood by reading and studying the following specification.

Single-ended sensing devices for sensing a programmed state of a floating-gate memory cell are described herein for use in low-voltage memory devices. Sensing devices in accordance with the various embodiments include an input node selectively coupled to a floating-gate memory cell. Such sensing devices include a precharging path for applying a precharge potential to the input node of the sensing device. The precharge potential is used for precharging bit lines prior to sensing the programmed state of the floating-gate memory cell. Such sensing devices further include a reference current path for applying a reference current to the input node of the sensing device. Such sensing devices still further include a sense inverter having an input coupled to the input node of the sensing device and an output for providing an output signal indicative of the programmed state of the floating-gate memory cell. The reference current is applied to the input node of the sensing device during sensing of the programmed state of the floating-gate memory cell, thus compensating for residual current and improving immunity to erroneous indications of an erased floating-gate memory cell.

For one embodiment, the invention provides a single-ended sensing device for sensing a programmed state of a floating-gate memory cell. The sensing device has an input node selectively coupled to the floating-gate memory cell. The sensing device includes a precharging path coupled between a first potential node and the input node of the sensing device, wherein the first potential node is coupled to receive a precharge potential. The sensing device further includes a reference current path coupled between a second potential node and the input node of the sensing device, wherein the second potential node is coupled to receive a second potential for providing a reference current to the input node of the sensing device. The sensing device still further includes a sense inverter having an input coupled to the input node of the sensing device and an output for providing an output signal responsive to a potential level of the input node of the sensing device relative to a threshold point, wherein the output signal is indicative of the programmed state of the floating-gate memory cell. For a further embodiment, the sensing device further includes a reference current control signal generator having an output node coupled to the gate of a p-channel field-effect transistor of the reference current path for providing a reference current control signal for applying the reference current. The reference current control signal generator includes a diode coupled between a potential node and the output node of the reference current control signal generator and a resistive component coupled between another potential node and the output node of the reference current control signal generator.

For another embodiment, the invention provides a method of sensing a programmed state of a floating-gate memory cell. The method includes coupling a bit line to an input node of a single-ended sensing device, wherein the bit line is coupled to a source/drain region of the floating-gate memory cell, coupling the bit line and the input node to a first potential node to receive a precharge potential, applying a reference current to the input node, driving a word line coupled to a control gate of the floating-gate memory cell, and isolating the bit line and the input node from the first potential node. The method further includes sensing a potential level at the input node while applying the reference current, wherein the potential level at the input node is indicative of the programmed state of the floating-gate memory cell. For a further embodiment, applying a reference current to the input node includes generating a reference current and applying the reference current to the input node, wherein the reference current varies inversely with changes in ambient temperature.

The invention further provides memory devices and electronic systems making use of such sensing devices. The invention still further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Figure 1A:
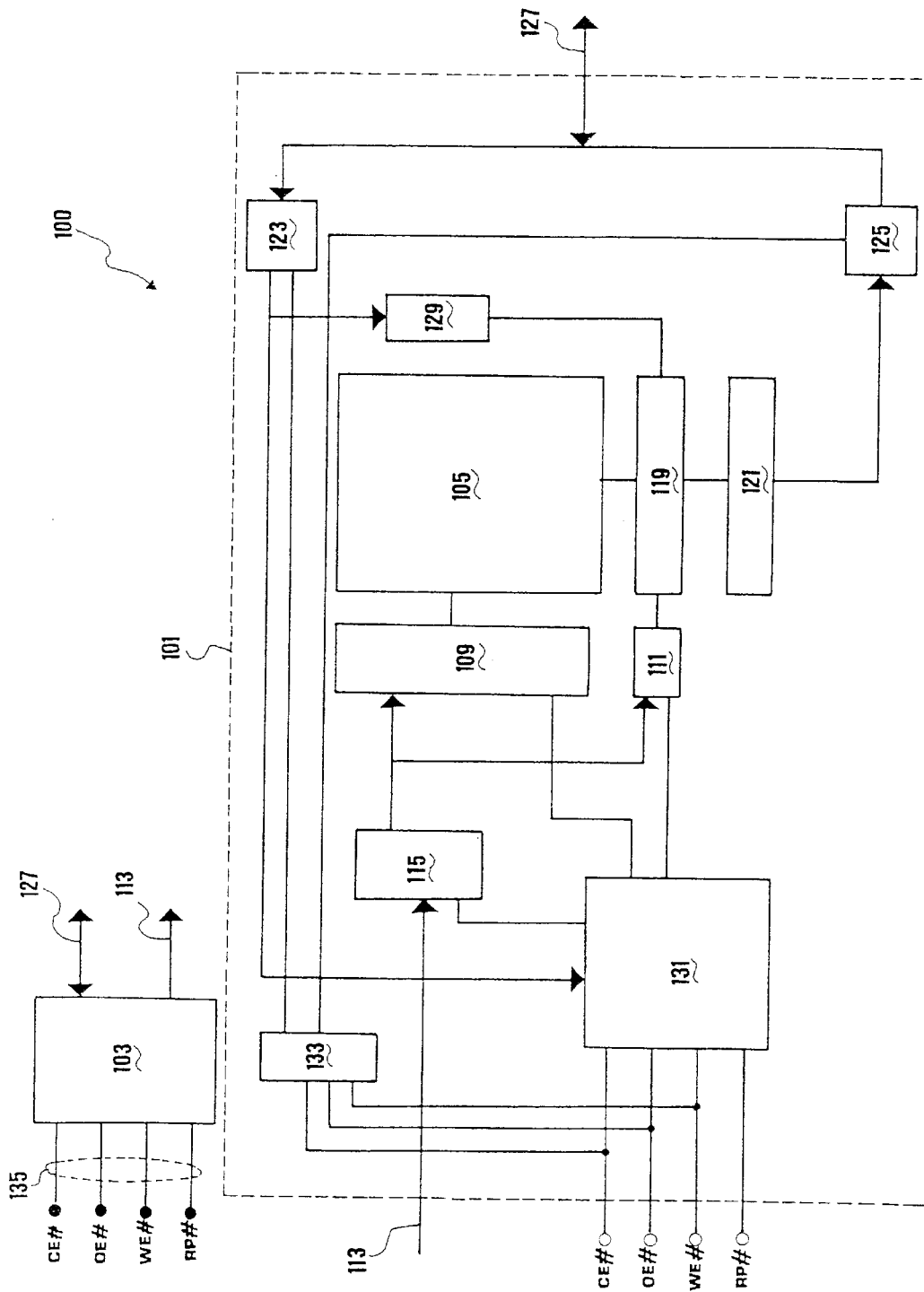
FIG. 1A is a block diagram of a basic flash memory device coupled to a processor as part of an electronic system.

Sensing devices in accordance with the various embodiments are adaptable for a variety of memory devices, including flash memory devices. FIG. 1A is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

A row decoder 109 and a column decoder 111 are provided to decode address signals provided on address lines A0–Ax 113. An address buffer circuit 115 is provided to latch the address signals. Address signals are received and decoded to access the memory array 105. A column select circuit 119 is provided to select a column of the memory array 105 in response to control signals from the column decoder 111. Sensing circuitry 121 is used to sense and amplify data stored in the memory cells. Sensing circuitry 121 includes a sensing device in accordance with the various embodiments of the invention. Data input 123 and output 125 buffer circuits are included for bi-directional data communication over a plurality of data (DQ) lines 127 with the processor 103. A data latch 129 is typically provided between data input buffer circuit 123 and the DQ lines 127 for storing data values (to be written to a memory cell) received from the DQ lines 127. Data amplified by the sensing circuitry 121 is provided to the data output buffer circuit 125 for output on the DQ lines 127.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals. As stated above, the flash memory device 101 has been simplified to facilitate a basic understanding of the features of the memory. A more detailed understanding of flash memories is known to those skilled in the art.

Figure 1B:
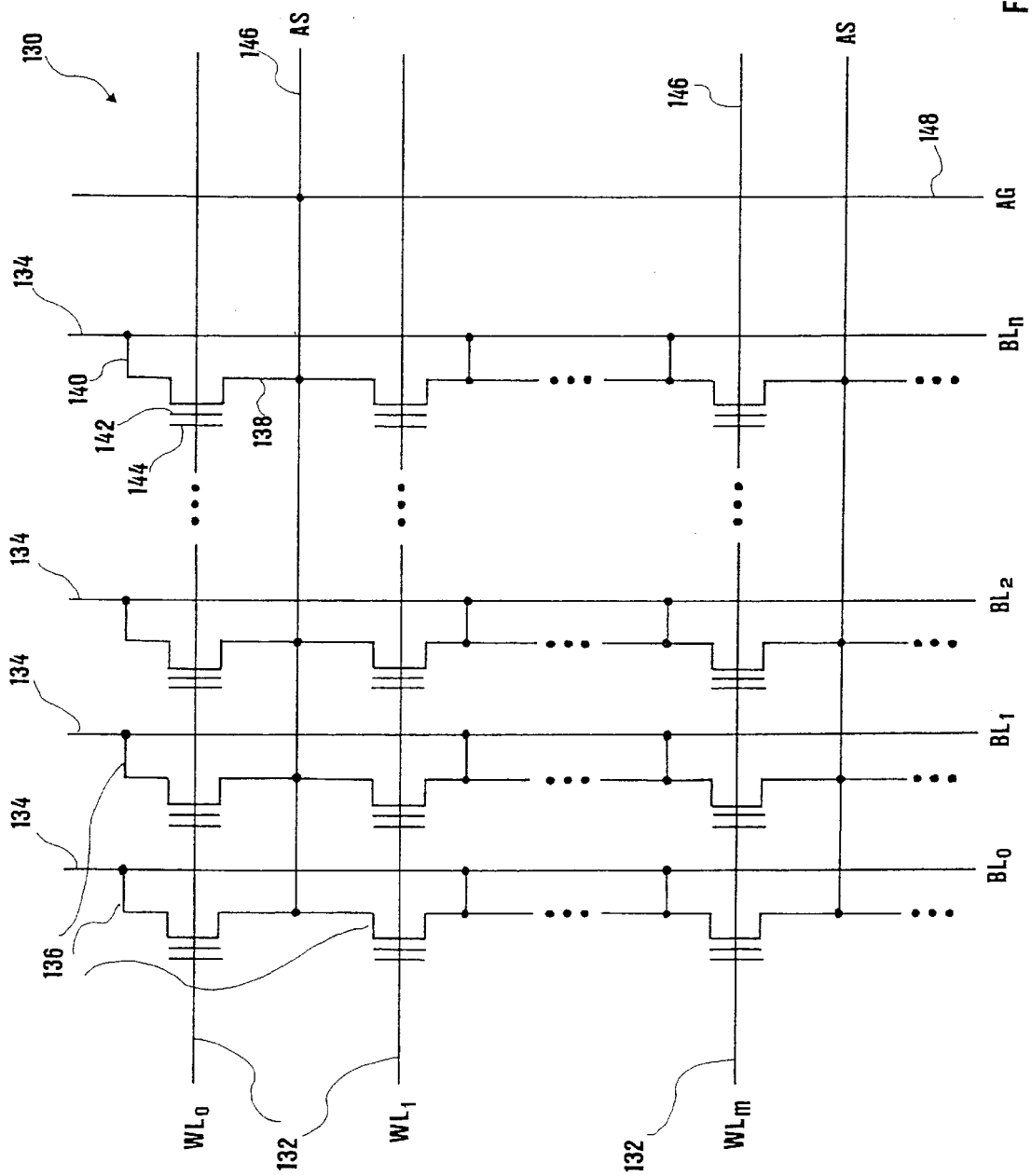
FIG. 1B is a schematic of a portion of a typical non-volatile memory main block as a portion of a memory array of a memory device of the type shown in FIG. 1A.

Arrays of flash memory cells are often configured as floating-gate transistors placed at the intersection of word lines and local bit lines. The word lines are coupled to the control gates of the floating-gate transistors. FIG. 1B is a schematic of a portion of a typical non-volatile memory main block 130 as a portion of the memory array 105.

The detail of main block 130 is provided to better understand the various embodiments of the invention. However, the invention is not limited to the specific floating-gate memory cell and layout described with reference to FIG. 1B.

As shown in FIG. 1B, the main block 130 includes word lines 132 and intersecting local bit lines 134. For ease of addressing in the digital environment, the number of word lines 132 and the number of local bit lines 134 are each some power of two, e.g., 256 word lines 132 by 4,096 local bit lines 134.

Floating-gate transistors 136 are located at each intersection of a word line 132 and a local bit line 134. The floating-gate transistors 136 represent the non-volatile memory cells for storage of data. Typical construction of such floating-gate transistors 136 include a source region 138 and a drain region 140 constructed from an $N^+$-type material of high impurity concentration formed in a P-type semiconductor substrate of low impurity concentration, a channel region formed between the source and drain, a floating gate 142, and a control gate 144. Floating gate 142 is isolated from the channel region by a tunneling dielectric and from the control gate 144 by an intergate dielectric. The materials of construction are not critical to the invention, but commonly include doped polysilicon for the gate materials, and silicon oxides, nitrides or oxynitrides for the dielectric materials. Floating-gate transistors 136 having their control gates 144 coupled to a word line 132 typically share a common source region 138 depicted as array source 146. To reduce resistance to each source region 138, each array source 146 is often coupled to a metal line to ground, such as array ground 148. As shown in FIG. 1B, floating-gate transistors 136 coupled to adjacent word lines 132 may share the same array source 146. Floating-gate transistors 136 have their drain regions 140 coupled to a local bit line 134. A column of the floating-gate transistors 136 are those transistors having their drain regions 140 commonly coupled to a given local bit line 134. A row of the floating-gate transistors 136 are those transistors having their control gates 144 commonly coupled to a given word line 132.

Figure 2:
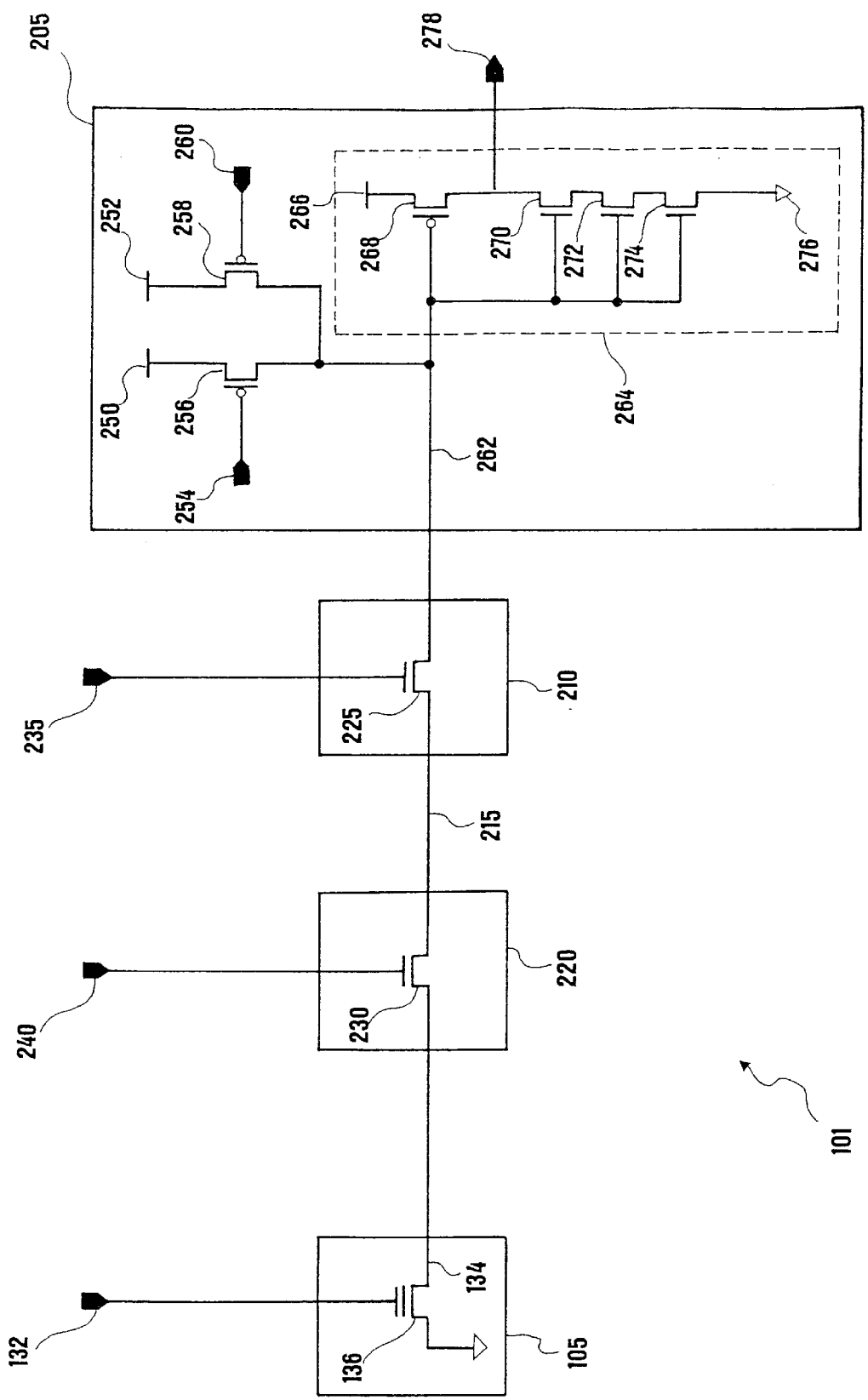
FIG. 2 is a schematic of a portion of a memory device showing a single-ended sensing device coupled to receive a reference current.

FIG. 2 is a schematic of a portion of a memory device 101 having at least one sensing device 205 in accordance with the invention. As shown in FIG. 2, a target memory cell 136 is selectively coupled to a sensing device 205 through its associated local bit line 134 and global bit line 215. As noted previously, there are generally many local bit lines 134 associated with a single global bit line 215 and many global bit lines 215 associated with a single sensing device 205 in typical high-density memory devices. The sensing device 205 is generally one of many sensing devices 205 contained in the sensing circuitry 121 as depicted in FIG. 1A.

The global bit line 215 associated with the target memory cell 136 is coupled to its associated sensing device 205 using pass circuit 210. Pass circuit 210 is depicted as containing a single selective coupling device or pass transistor 225 providing the selective coupling between the global bit line 215 and the sensing device 205. The pass transistor 225 has a gate coupled to receive a control signal from node 235. Those skilled in the art of memory devices will recognize that pass circuit 210 would contain additional pass transistors associated with other global bit lines. Furthermore, additional pass transistors may be interposed between the global bit line 215 and the sensing device 205.

The local bit line 134 associated with the target memory cell 136 is coupled to its associated global bit line 215 using pass circuit 220. Pass circuit 220 is depicted as containing a single selective coupling device or pass transistor 230 providing the selective coupling between the local bit line 134 and the global bit line 215. The pass transistor 230 has a gate coupled to receive a control signal from node 240. Those skilled in the art of memory devices will recognize that pass circuit 220 would contain additional pass transistors associated with other local bit lines. Furthermore, additional pass transistors may be interposed between the local bit line 134 and the global bit line 215. Pass circuits 210 and 220 may represent a portion of the column select circuit 119 of FIG. 1A.

The sensing device 205 includes a precharging path for selectively applying the precharge potential to charge the local bit line 134, the global bit line 215, and the input node 262. The precharging path is shown in FIG. 2 as the p-channel field-effect transistor (pFET) 256 coupled between a potential node 250 and the input node 262. The potential node 250 is coupled to receive the precharge potential. The precharge potential may be a supply potential, such as Vcc. The pFET 256 selectively couples the potential node 250 to the input node 262 in response to a control signal received at node 254.

The sensing device 205 further includes a reference current path for selectively applying a reference current to the input node 262. Ideally, a target memory cell 136 and its path to the sensing device 205 would exhibit a zero current draw if the floating-gate transistor of the target memory cell 136 were programmed, i.e., in a first programmed state, such that the input node 262 would remain at the precharge potential during sensing. However, some residual current may be expected, whether such residual current is due to leakage, depletion, or some other phenomena. This residual current could result in an erroneous indication that the target memory cell is erased, i.e., in a second programmed state. The reference current path provides a reference current to the input node 262 to compensate for such residual currents and to avoid erroneous indications of the second programmed state.

The reference current path is shown in FIG. 2 as the pFET 258 coupled between the potential node 252 and the input node 262. The potential node 252 is coupled to receive a supply potential, such as Vcc. The reference current should be less than a current flow through the target memory cell 136 if the target memory cell 136 is erased or in the second programmed state, yet more than the expected residual current. For one embodiment, the reference current is controlled to be less than half of the expected current of an erased memory cell in the second programmed state. For a further embodiment, the reference current is controlled to be approximately one order of magnitude less than the expected current of an erased memory cell in the second programmed state. For one embodiment, the reference current is controlled through the application of a reference current control signal to the gate of the pFET 258 from node 260. Varying the potential level of the reference current control signal will vary the conductance of the pFET 258, resulting in control of the current flow through the reference current path.

The sensing device 205 still further includes a sense inverter 264 having a threshold point. The sense inverter generates an output signal at output node 278 in response to a potential level at the input node 262 relative to the threshold point. The potential level of the input node 262 is indicative of the state of the local bit line 134.

The sense inverter 264 includes a p-channel stage having a pFET 268 coupled between a potential node 266 and the output node 278. The potential node 266 is coupled to receive a supply potential, such as Vcc. The supply potential represents a first logic level, such as a logic high level. The sense inverter 264 further includes an n-channel stage having at least one n-channel field-effect transistor (nFET) coupled between the output node 278 and a potential node 276. The potential node 276 is coupled to receive a ground potential, such as Vss. The ground potential represents a second logic level, such as a logic low level. For the embodiment of FIG. 2, the sense inverter 264 includes nFET 270, nFET 272 and nFET 274 coupled in series between the output node 278 and the potential node 276. The pFET 268, nFET 270, nFET 272 and nFET 274 each have a gate coupled to the input node 262. The multiple nFET devices in the sense inverter 264 are used to move the threshold point closer to the precharge potential. The combination of a low voltage p-channel stage and a weak n-channel stage in the sense inverter 264 can maintain the threshold point near the precharge potential. Other methods of altering the threshold point of the sense inverter 264 may be used, such as varying the sizing of the FET devices.

During sensing, if the target memory cell is in the second programmed state, the bit lines will be expected to drop to a potential below the precharge potential. The expected bit line potential is approximately the precharge potential minus the threshold voltage of the transistors minus some delta for ohmic drop across the bit lines. The threshold point of the sense inverter 264 must be some potential level higher than this expected bit line potential in order to reliably detect and amplify the data value of the target memory cell. For one embodiment, the expected minimum bit line potential is approximately 0.94V and the threshold point of the sense inverter 264 is approximately 1.1V using a supply potential and precharge potential of approximately 1.8V.

Operation of the memory device 101 proceeds generally as follows. The bit lines 134 and 215 are decoded and coupled to the input node 262 of a sensing device 205. The decoded bit lines may be thought of as a single bit line coupled to the target memory cell. The bit line and the input node 262 are precharged to the precharge potential from the potential node 250 and the word line 132 of the target memory cell 136 is driven. In addition, a reference current is applied to the input node 262 of the sensing device 205 through the reference current path. The bit line is then isolated from the precharge potential while maintaining application of the reference current. The programmed state of the target memory cell 136 is sensed and amplified by the sensing device 205. The data value at the output node 278 is latched and the memory device is returned to a low power mode.

For one embodiment, a reference current control signal generator is used to control the reference current to mimic the expected residual current of the target memory cell. For a further embodiment, the memory device includes one such reference current control signal generator for each sensing device. For another embodiment, the memory device includes one such reference current control signal generator for some number of sensing devices. For a further embodiment, the memory device includes one such reference current control signal generator for each word of output or every 16 sensing devices.

To best mimic the expected residual current of a floating-gate memory cell, it may be desirable to utilize a similar floating-gate memory cell in controlling the reference current. However, use of a dummy floating-gate memory cell requires a trimming operation and leads to undesirable testing during fabrication. As described herein, a resistive component may be used in the reference current control signal generator in place of the floating-gate memory cell to avoid the unnecessary trimming and testing of a dummy floating-gate memory cell.

Figure 3:
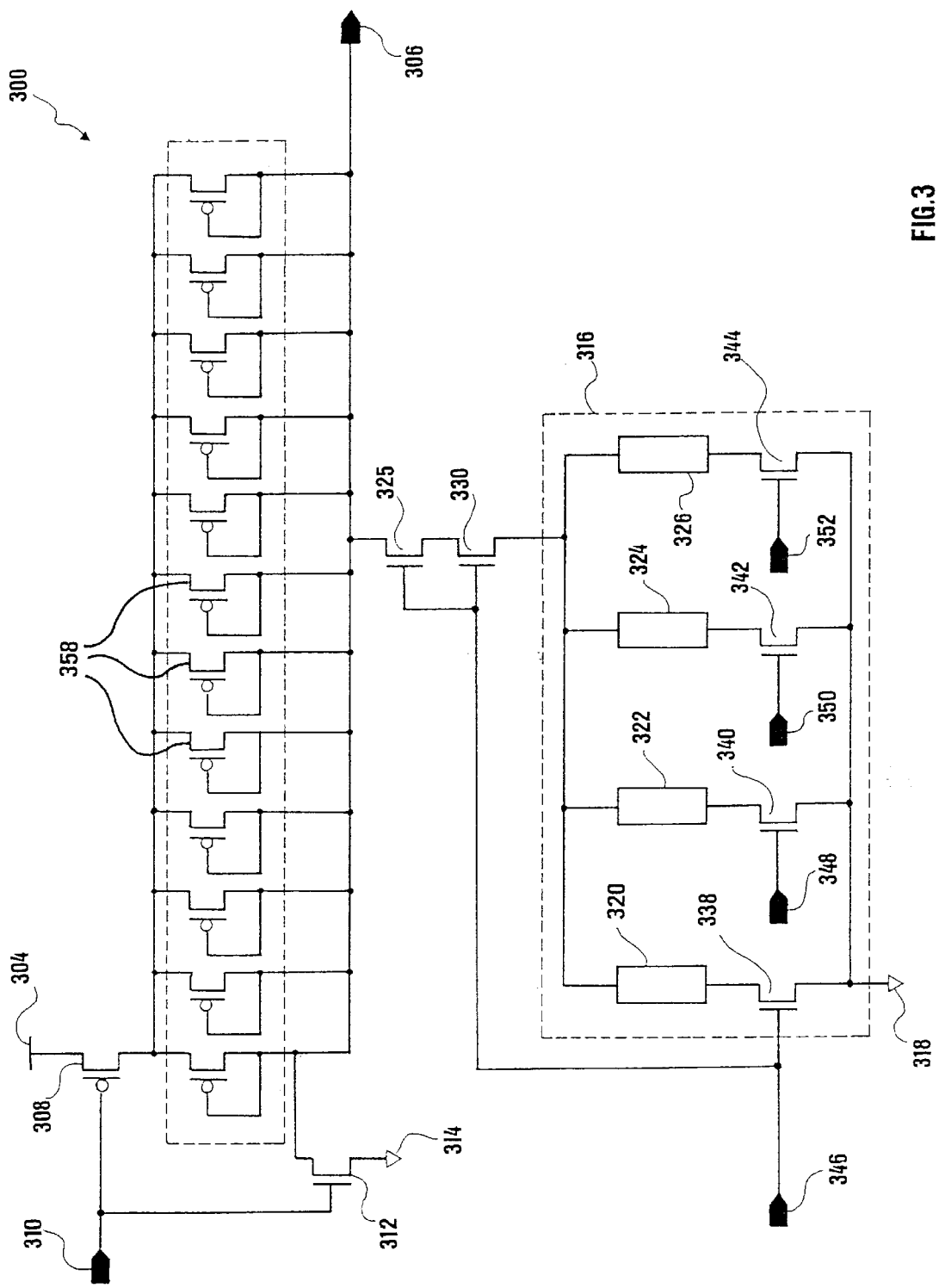
FIG. 3 is a schematic of a reference current control signal generator for use with a sensing device of the type shown in FIG. 2.

FIG. 3 is a schematic of a reference current control signal generator 300 in accordance with an embodiment of the invention. The reference current control signal generator 300 provides the reference current control signal as an output signal. For one embodiment, the reference current control signal has a potential level that varies proportionately with changes in ambient temperature. As ambient temperature increases, the reference current control signal increases. In turn, the pFET 258 is pushed closer to deactivation with a resultant decrease in the value of the reference current such that the reference current varies inversely with changes in ambient temperature. This will tend to track changes in current flow through a target memory cell in the erased state, as this current also tends to decrease in response to increasing ambient temperatures. The reference current is preferably proportional to the current flow through a target memory cell in the erased state to maintain consistent sensing conditions.

The reference current control signal generator 300 includes a diode 302 having an input coupled to receive a supply potential from a potential node 304 and an output coupled to an output node 306. The potential node 304 is preferably coupled to receive the same supply potential received at the potential node 266 of the sense inverter 264, e.g., the supply potential Vcc. The output node 306 is coupled to the node 260 to provide the control signal to the gate of the pFET 258 of a sensing device 205. For the embodiment depicted in FIG. 3, the diode 302 contains an array of one or more diode-connected field-effect transistors such as pFETs 358. The pFETs 358 are coupled in parallel between the input and output of the diode 302. Each pFET 358 has a gate coupled to the output of the diode 302, a first source/drain region coupled to the input of the diode 302, and a second source/drain region coupled to the output of the diode 302. For one embodiment, each pFET 358 is preferably sized to be substantially identical to the pFET 258 of the sensing device 205. For a further embodiment, the diode 302 includes 12 pFETs 358 coupled in parallel, each sized to be substantially identical to the pFET 258 of the sensing device 205. For a still further embodiment, the output node 306 is concurrently coupled to 16 sensing devices 205.

The reference current control signal generator 300 may optionally be selectively enabled or disabled. An enable signal received at node 310 may be used to enable or disable the reference current control signal generator 300 by providing an FET of a first type, such as pFET 308, coupled between the potential node 304 and the input of the diode 302 and having its gate coupled to receive the enable signal. The reference current control signal generator 300 is enabled when the input of the diode 302 is actively coupled to receive the supply potential from the potential node 304. The enable signal received at node 310 may also be used to pull the output node 306 to a ground potential when the reference current control signal generator 300 is disabled by providing an FET of an opposite type, such as nFET 312, coupled between the output node 306 and a ground potential node 314 and having its gate coupled to receive the enable signal.

The reference current control signal generator 300 further includes a resistive component 316 coupled between the output node 306 and a potential node 318. The potential node 318 is coupled to receive a ground potential. The potential node 318 is preferably coupled to receive the same ground potential received at the potential node 276 of the sense inverter 264, e.g., the ground potential Vss. The resistive component 316 includes at least one resistive element, such as resistive element 320. Additional resistive elements, such as resistive elements 322, 324 and 326, may be coupled in parallel with the resistive element 320. As shown in FIG. 3, each resistive element may selectively present an open path to allow post-fabrication adjustment of resistance of the resistive component 316. This will allow finer adjustment and control of the reference current generated in response to the reference current control signal.

The first resistive element 320 has a first resistance value, the second resistive element 322 has a second resistance value, the third resistive element 324 has a third resistance value and the fourth resistive element 326 has a fourth resistance value. For one embodiment, the second resistance value is substantially equal to the first resistance value, the third resistance value is approximately one-half the first resistance value and the fourth resistance value is approximately one-fourth the first resistance value. For a further embodiment, the first resistance value is approximately 16 k$\Omega$. As shown, resistive element 322 selectively presents an open path using nFET 340 in response to a control signal received at node 348, resistive element 324 selectively presents an open path using nFET 342 in response to a control signal received at node 350, and resistive element 326 selectively presents an open path using nFET 344 in response to a control signal received at node 352. Each control signal is distinct, allowing selection of the combined resistance value of the resistive component 316 after fabrication.

The reference current control signal generator 300 may further include one or more field-effect transistors coupled between the output node 306 and the resistive component 316. For the embodiment depicted in FIG. 3, the reference current control signal generator 300 includes a first nFET 325 and a second nFET 330 coupled in series between the output node 306 and the resistive component 316. For one embodiment, the nFET 325 is preferably sized to be substantially identical to the pass transistor 225 of the pass circuit 210 and the nFET 330 is preferably sized to be substantially identical to the pass transistor 230 of the pass circuit 220.

The nFET 325 and nFET 330 each have their gate coupled to receive a control signal on node 346. The nFET 338 coupled between the resistive element 320 and the second potential node 318 further has its gate coupled to receive the control signal on node 346. The node 346 may be coupled to receive a supply potential as the control signal, thereby activating the nFETs 325, 330 and 338. Alternatively, the node 346 may be coupled to receive the output of a voltage divider. As such, the control signal may be a reduced potential level, such as Vcc/2, and may result in at least a partial activation of the nFETs 325, 330 and 338.

It is noted that the pass transistor 225 of the pass circuit 210 acts as a cascode amplifier having a high input capacitance and a low output capacitance; the capacitance of the global bit line 215 is typically orders of magnitude larger than the capacitance of the input node 262 of the sensing device 205. While this will lead to fast reaction times at the input node 262 to a current sink through the target memory cell, it also reduces the immunity of the sensing device 205 to noise in the control signal to the gate of the pass transistor 225. For improved reliability, it is preferred that signal noise be suppressed for the control signal received at node 235 at least during sensing of the programmed state of the target memory cell. U.S. patent application Ser. No. (Atty Docket No. 400.071US01 claiming priority to Italian Patent Application RM2000A000698) entitled "Supply Noise Reduction in Memory Device Column Selection," which is commonly assigned, describes methods and circuits for suppressing noise for such control signals. An example of one such circuit and method for suppressing noise will be described with reference to FIG. 4.

The sensing device 205 has three phases of operation, i.e., a first sensing phase for precharging and address decoding, a second sensing phase for sensing the programmed state of the target memory cell, and a non-sensing phase for isolation of the sensing device from the memory cells. The driver circuit 400 of FIG. 4 has three states corresponding to these three phases of operation. In the first and second sensing phases, the pass transistor 225 is activated to permit coupling of the target memory cell 136 to its associated sensing device 205. During the first sensing phase, the pass transistor 225 receives its activating control signal using an unfiltered path. During the first sensing phase, the sensing device 205 is tolerant of noise. To improve transition speeds of the pass transistor 225, the control signal on node 235 is preferably unfiltered. During the second sensing phase, the pass transistor 225 receives its activating control signal through a filtered path and is isolated from the unfiltered path. As the programmed state of the target memory cell is being sensed during the second sensing phase, it is desirable to suppress noise at node 235. The pass transistor 225 is simply being maintained in the activated state during the second sensing phase such that transition speed is inconsequential. In the non-sensing phase, the pass transistor 225 is deactivated to isolate the target memory cell 136 from its associated sensing device 205.

Figure 4:
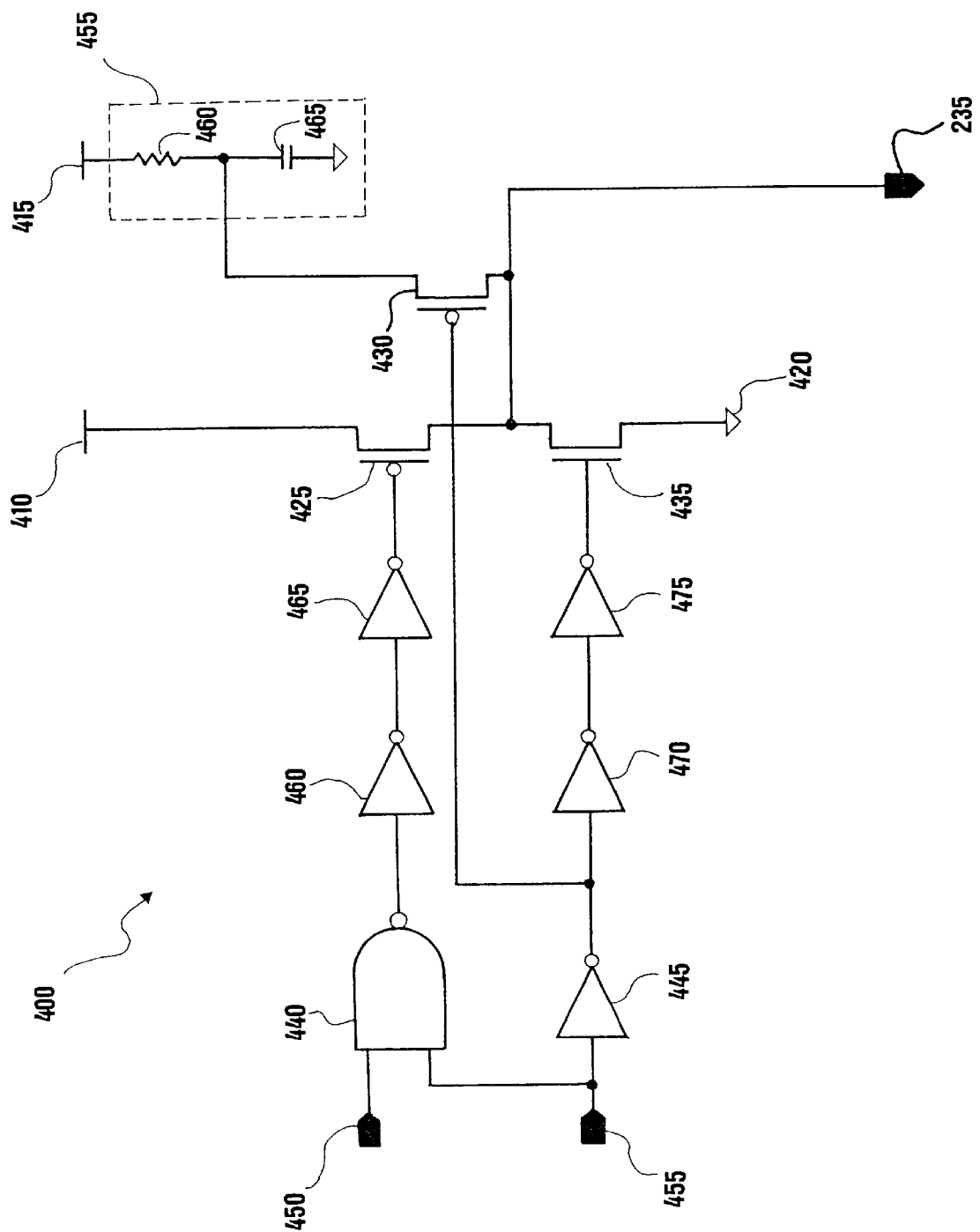
FIG. 4 is a schematic of a driver circuit for use with a pass circuit and sensing device of the types shown in FIG. 2.

As shown in FIG. 4, a first control signal is applied to a first input of NAND gate 440 from node 450. The first control signal, herein referred to as FILTER_ON, is indicative of whether the pass transistor 225 should be isolated from the unfiltered supply potential. Using the logic circuits as shown in FIG. 4, a logic low level of FILTER_ON indicates that the pass transistor 225 is to be isolated from the potential node 410 while a logic high level indicates that the pass transistor 225 may be coupled to the potential node 410. The potential node 410 is coupled to receive a supply potential such as Vcc. A second control signal is applied to a second input of NAND gate 440 and to an inverter 445 from node 455. The second control signal, herein referred to as YPASS, is indicative of whether the pass transistor 225 should be activated or deactivated. Using the logic circuits as shown in FIG. 4, a logic low level of YPASS indicates that the pass transistor 225 is to be coupled to potential node 420 for deactivation while a logic high level indicates that the pass transistor 225 is to be coupled to at least one of potential nodes 410 and 415 for activation. The potential node 420 is coupled to receive a ground potential such as Vss. The potential node 415, like potential node 410, is coupled to receive the supply potential.

In operation, the memory device 101 initially may be in the non-sensing phase of operation, at least as it relates to the target memory cell 136. The YPASS control signal, for the logic circuits as depicted in FIG. 4, has a logic low level during the non-sensing phase. The output of the inverter 445 applied to the gate of pFET 430, now a logic high level, will deactivate pFET 430 and isolate the gate of the pass transistor 225 from potential node 415. Because the nFET 435 is of a type opposite the pFET 430, its response to the same control signal will be opposite. As such, the output of the inverter 445 applied to the gate of the nFET 435 will activate nFET 435, thus coupling the gate of the pass transistor 225 to potential node 420. The output of the NAND gate 440 will also have a logic high level, thus deactivating pFET 425 and isolating the gate of the pass transistor 225 from potential node 410. Isolating the gate of the pass transistor 225 from the supply potentials and coupling it to the ground potential will thus provide a control signal having a logic low level, resulting in deactivation of the n-channel pass transistor 225 and isolation of the target memory cell 136 from the sensing device 205.

Using the logic circuits as depicted in FIG. 4, the YPASS control signal and the FILTER_ON control signal each have a logic high level during the first sensing phase. In this manner, the gate of the pass transistor 225 is coupled to the potential node 410 to receive an unfiltered supply potential. The gate of the pass transistor 225 is concurrently isolated from the potential node 420. In this configuration, the gate of the pass transistor 225 is also coupled to the potential node 415 through a filtered path. The filtered path of the driver circuit 400 includes the path from the potential node 415 to the node 235 through the filter 455 and the selective coupling device pFET 430. Filter 455 serves to reduce noise, or undesirable fluctuations, in the supply potential received at potential node 415. Filter 455 may be a lowpass RC filter, having a resistive component 460 and a capacitive component 465, to reduce high-frequency noise. While it is not necessary to concurrently couple the gate of the pass transistor 225 to both potential nodes 410 and 415 during the first sensing phase, there are advantages to doing so. By concurrently coupling the gate of the pass transistor 225 to both potential nodes 410 and 415 during the first sensing phase, the capacitive component 465 in the filtered path is quickly charged. Subsequent transition to the second sensing phase, as described below, will not risk loss of the activating gate bias on pass transistor 225 due to the RC time constant of an uncharged filter.

During the second sensing phase, the memory device 101 senses the programmed state of the target memory cell 136 and thus its data value. To improve operating margins of the sensing device 205, especially in low-voltage applications, it is desirable to reduce noise in the supply potential provided to the gate of the pass transistor 225. Accordingly, the gate of the pass transistor 225 should be coupled to the potential node 415 through the filtered path and isolated from the potential node 410.

Using the logic circuits as depicted in FIG. 4, the YPASS control signal remains at the logic high level and the FILTER_ON control signal transitions to a logic low level during the second sensing phase. In this manner, the gate of the pass transistor 225 is isolated from the potential nodes 410 and 420, but is coupled to the potential node 415 through the filtered path. The gate of the pass transistor 225 thus receives a filtered supply potential as its control signal, resulting in improved noise immunity of the sensing operation. As shown in FIG. 4, the outputs of the NAND gate 440 and the inverter 445 may be buffered, such as by the pairs of inverters 460/465 and 470/475, respectively.

After latching the detected data value, the memory device may return to the non-sensing phase of operation. Timing of the various phases of operation is controlled by the command control circuit of the memory device. The various control signals, such as FILTER_ON and YPASS, are generated by the command control circuit for control of access to the memory array as described herein.

For improved performance of the sensing device 205, it is important that the timing of the bit line precharging be controlled tightly. The precharging should be sufficient to completely charge the parasitics of the bit lines to provide consistent sensing operations. An insufficient precharge may lead to an erroneous indication of an erased state of the target memory cell. However, for improved access speed, this precharging should not be any longer than necessary to charge these parasitics. Timing of an operation phase such as the precharging phase is generally controlled by a timing signal or pulse. Pulse generators for generating a timing pulse often provide compensation for changes in supply voltage, but may exhibit unacceptable variation as a result of changes in ambient temperature. U.S. patent application Ser. No. (Atty Docket No. 400.057US01 claiming priority to Italian Patent Application RM2000A000700) entitled "Voltage and Temperature Compensated Pulse Generator," which is commonly assigned, describes methods and circuits for generating a timing pulse including compensation for supply voltage and ambient temperature. An example of one such circuit and method for generating such a timing pulse will be described with reference to FIG. 5.

Figure 5:
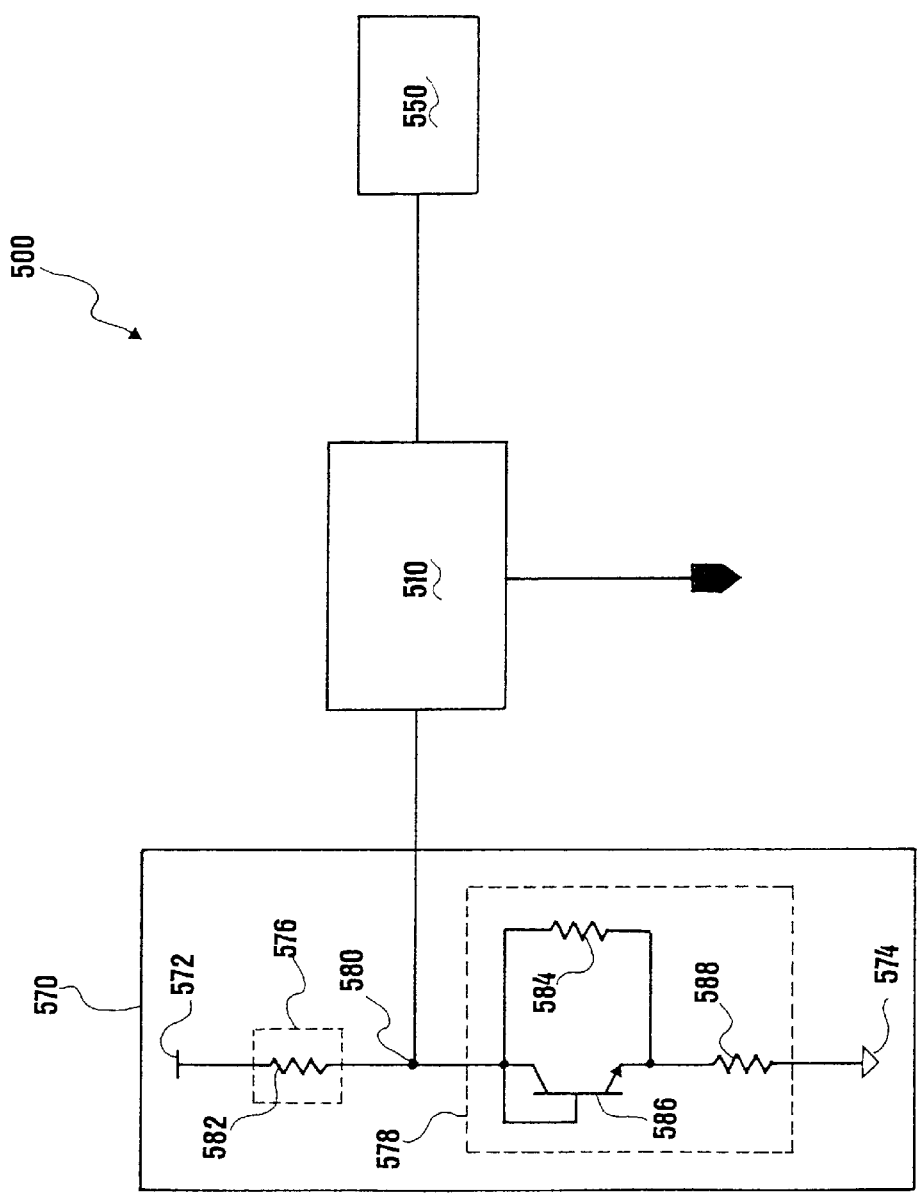
FIG. 5 is a schematic of a timing circuit for use with a sensing device of the type shown in FIG. 2.

FIG. 5 is a schematic of a pulse generator 500 having a comparator 510, a ramp signal generator 550 and an adaptive threshold signal generator 570. The ramp signal generator 550 is often an RC circuit. The comparator 510 provides an output signal in response to a difference between a potential level of a threshold signal generated by the threshold signal generator 570 and a potential level of a ramp signal generated by the ramp signal generator 550.

The adaptive threshold signal generator 570 of FIG. 5 includes an upper resistive component 576 coupled between a first potential node 572 and an output node 580. The upper resistive component 576 of FIG. 5 includes a resistive element 582. As is well known in the art, resistive elements or resistors may be configured in a variety of parallel configurations, series configuration, or combination parallel/series configurations to produce equivalent resistive elements. Accordingly, for additional embodiments, the resistive element 582 may represent two or more resistive elements in a variety of parallel, series, or parallel/series configurations. For one embodiment, the resistive element 582 contains one or more semiconductor resistors and the upper resistive component 576 has a positive temperature coefficient of resistivity.

The upper resistive component 576 has an effective temperature coefficient of resistivity that is the composite of the temperature coefficients of resistivity of all of its resistive elements. For the embodiment depicted in FIG. 5, the effective temperature coefficient of resistivity of the upper resistive component 576 equals the temperature coefficient of resistivity of the resistive element 582.

The adaptive threshold signal generator 570 of FIG. 5 further includes a lower resistive component 578 coupled between a second potential node 574 and the output node 580. The first potential node 572 is coupled to receive a first potential and the second potential node 574 is coupled to receive a second potential, with the first potential higher than the second potential. For one embodiment, the first potential node 572 is coupled to receive a supply potential, such as Vcc, and the second potential node 574 is coupled to receive a ground potential, such as Vss.

The lower resistive component 578 has an effective temperature coefficient of resistivity that is lower than the effective temperature coefficient of resistivity of the upper resistive component 576. To accomplish this, the lower resistive component 578 includes at least one resistive element having a temperature coefficient of resistivity lower than the effective temperature coefficient of resistivity of the upper resistive component 576. For one embodiment, the lower resistive component 578 includes at least one resistive element having a temperature coefficient of resistivity lower than the lowest temperature coefficient of resistivity of any resistive element of the upper resistive component 576. For another embodiment, the lower resistive component 578 includes at least one resistive element having a negative temperature coefficient of resistivity.

For the embodiment depicted in FIG. 5, the lower resistive component 578 includes, as a resistive element, a bipolar junction transistor (BJT) 586 having its base coupled to its collector. The BJT 586 has a negative temperature coefficient of resistivity. As an example, the base-emitter bias, Vbe, of an npn BJT may change by $-0.2$ mV/$^\circ$ C. in this configuration. Additional resistive elements, such as resistive elements 584 and 588 can be used to adjust the nominal resistance level of the lower resistive component 578 to produce a desired resistance ratio between the upper resistive component 576 and the lower resistive component 578, and thus to produce a desired threshold signal for a given set of first and second potentials. For the embodiment depicted in FIG. 5, resistive element 584 is coupled in parallel with BJT 586 while resistive element 588 is coupled in series with BJT 586. For one embodiment, the resistive elements 584 and 588 each contain semiconductor resistors, each having a positive temperature coefficient of resistivity. As with the resistive element 582, resistive elements 584 and 588 may each represent one or more resistive elements in a variety of parallel configurations, series configurations, or combination parallel/series configurations.

Increasing resistance levels in the RC circuit of the ramp generator will lead to a decreasing slope of the ramp signal. If the threshold signal remains substantially constant, a decreasing slope of the ramp signal will lead to a larger pulse width from the comparator as it will take longer for the ramp signal to equal or exceed the threshold signal. To compensate for this undesirable temperature variation in the ramp signal generator, the threshold signal generator 570 includes a lower resistive component 578 having an effective temperature coefficient of resistivity that is lower than an effective temperature coefficient of the upper resistive component 576. In the voltage divider configuration, this difference in effective temperature coefficients of resistivity results in a decreasing threshold signal in response to increasing ambient temperatures, thus compensating for the decreasing slope of the ramp signal and leading to a more consistent timing pulse over a range of operating conditions.

CONCLUSION

Single-ended sensing devices for sensing a programmed state of a floating-gate memory cell have been described for use in low-voltage memory devices. Sensing devices in accordance with the various embodiments include an input node selectively coupled to the floating-gate memory cell. Such sensing devices include a precharging path for applying a precharge potential to the input node of the sensing device for precharging bit lines prior to sensing the programmed state of the floating-gate memory cell. Such sensing devices further include a reference current path for applying a reference current to the input node of the sensing device. Such sensing devices still further include a sense inverter having an input coupled to the input node of the sensing device and an output for providing an output signal indicative of the programmed state of the floating-gate memory cell. The reference current is applied to the input node of the sensing device during sensing of the programmed state of the floating-gate memory cell, thus compensating for residual current and improving immunity to erroneous indications of an erased floating-gate memory cell.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A sensing device for sensing a programmed state of a floating-gate memory cell, wherein the sensing device has an input node selectively coupled to the floating-gate memory cell, the sensing device comprising:
   a precharging path coupled between a first potential node and the input node of the sensing device, wherein the first potential node is coupled to receive a precharge potential;
   a reference current path coupled between a second potential node and the input node of the sensing device, wherein the second potential node is coupled to receive a second potential for providing a reference current to the input node of the sensing device; and
   a sense inverter having an input coupled to the input node of the sensing device and an output for providing an output signal responsive to a potential level of the input node of the sensing device relative to a threshold point, wherein the output signal is indicative of the programmed state of the floating-gate memory cell.

2. The sensing device of claim 1, wherein the sense inverter further comprises:
   a p-channel stage coupled between a third potential node and the output of the sense inverter, the p-channel stage comprising at least one p-channel field-effect transistor each having a gate coupled to the input node of the sensing device; and
   an n-channel stage coupled between a fourth potential node and the output of the sense inverter, the n-channel stage comprising at least one n-channel field-effect transistor each having a gate coupled to the input node of the sensing device;
   wherein the third potential node is coupled to receive a third potential; and
   wherein the fourth potential node is coupled to receive a fourth potential.

3. The sensing device of claim 2, wherein the second potential and the third potential are each a supply potential and the fourth potential is a ground potential.

4. The sensing device of claim 2, wherein the p-channel stage includes one p-channel field-effect transistor and the n-channel stage includes three n-channel field-effect transistors coupled in series.

5. The sensing device of claim 1, wherein the precharging path further comprises a field-effect transistor coupled between the first potential node and the input node of the sensing device.

6. The sensing device of claim 1, wherein the reference current path further comprises a field-effect transistor coupled between the second potential node and the input node of the sensing device and having a gate coupled to receive a reference current control signal.

7. The sensing device of claim 6, wherein the field-effect transistor of the reference current path is a p-channel field-effect transistor.

8. The sensing device of claim 7, further comprising a reference current control signal generator having an output node coupled to the gate of the p-channel field-effect transistor of the reference current path for providing the reference current control signal, the reference current control signal generator comprising:
- a diode coupled between a fifth potential node and the output node of the reference current control signal generator, wherein the fifth potential node is coupled to receive a fifth potential; and
- a resistive component coupled between a sixth potential node and the output node of the reference current control signal generator, wherein the sixth potential node is coupled to receive a sixth potential.

9. The sensing device of claim 8, wherein the second potential, the third potential and the fifth potential are each a supply potential and wherein the fourth potential and the sixth potential are each a ground potential.

10. The sensing device of claim 9, wherein the third potential and the fifth potential are the same supply potential and the fourth potential and the sixth potential are the same ground potential.

11. The sensing device of claim 8, wherein the diode further comprises a plurality of diode-connected field-effect transistors coupled in parallel between the fourth potential node and the output node of the reference current control signal generator.

12. The sensing device of claim 11, wherein each field-effect transistor of the plurality of diode-connected field-effect transistors is a p-channel field-effect transistor sized to be substantially identical to the p-channel field-effect transistor of the reference current path.

13. The sensing device of claim 8, wherein the reference current control signal generator further comprises:
- at least one field-effect transistor coupled between the resistive component and the output node of the reference current control signal generator.

14. The sensing device of claim 13, wherein each at least one field-effect transistor is sized to be substantially identical to a pass transistor coupled between a target memory cell and the input node of the sensing device.

15. The sensing device of claim 8, wherein the resistive component further comprises:
- a first resistive element coupled between the sixth potential node and the output node of the reference current control signal generator;
- a first field-effect transistor coupled between the first resistive element and the sixth potential node and responsive to a first control signal;
- a second resistive element coupled in parallel with the first resistive element between the sixth potential node and the output node of the reference current control signal generator; and
- a second field-effect transistor coupled between the second resistive element and the sixth potential node and responsive to a second control signal different from the first control signal.

16. The sensing device of claim 15, wherein the first control signal is a supply potential.

17. The sensing device of claim 15, wherein the first control signal is received from an output of a voltage divider.

18. The sensing device of claim 15, wherein the first control signal is approximately Vcc/2.

19. The sensing device of claim 15, wherein the resistive component further comprises:
- at least one additional resistive element coupled in parallel with the first resistive element between the sixth potential node and the output node of the reference current control signal generator; and
- at least one additional field-effect transistor, each additional field-effect transistor coupled between one of the additional resistive elements and the sixth potential node and each additional field-effect transistor responsive to an additional control signal different from the first control signal.

20. The sensing device of claim 8, wherein the resistive component comprises a plurality of resistive elements selectively coupled in parallel between the sixth potential node and the output node of the reference current control signal generator.

21. The sensing device of claim 7, further comprising a reference current control signal generator having an output node coupled to the gate of the p-channel field-effect transistor of the reference current path for providing the reference current control signal, the reference current control signal generator comprising:
- a plurality of diode-connected p-channel field-effect transistors, each diode-connected p-channel field-effect transistor having a first source/drain region coupled to receive a fifth potential from a fifth potential node, a second source/drain region coupled to the output node of the reference current control signal generator, and a gate coupled to output node of the reference current control signal generator, wherein each p-channel field-effect transistor of the plurality of diode-connected p-channel field-effect transistors is sized to be substantially identical to the p-channel field-effect transistor of the reference current path;
- a first n-channel field-effect transistor having a first source/drain region coupled to the output node of the reference current control signal generator, a second source/drain region, and a gate coupled to receive a first control signal, wherein the first n-channel field-effect transistor is sized to be substantially identical to a first pass transistor coupled between the floating-gate memory cell and the sensing device;
- a second n-channel field-effect transistor having a first source/drain region coupled to the second source/drain region of the first field-effect transistor, a second source/drain region, and a gate coupled to receive the first control signal, wherein the second n-channel field-effect transistor is sized to be substantially identical to a second pass transistor coupled between the floating-gate memory cell and the sensing device; and
- a resistive component having an input coupled to the second source/drain region of the second field-effect transistor and an output coupled to receive a sixth potential from a sixth potential node, the resistive component including a first resistive element coupled between the second source/drain region of the second field-effect transistor and the sixth potential node and a third n-channel field-effect transistor coupled between the first resistive element and the sixth potential node, the third n-channel field effect transistor having a gate coupled to receive the first control signal;

wherein the third potential and the fifth potential are the same potential and that potential is a supply potential; and wherein the fourth potential and the sixth potential are the same potential and that potential is a ground potential.

22. The sensing device of claim 21, wherein the first control signal is a supply potential.

23. The sensing device of claim 21, wherein the first control signal is received from an output of a voltage divider.

24. The sensing device of claim 21, wherein the first control signal is approximately Vcc/2.

25. The sensing device of claim 15, wherein the resistive component further comprises:
- at least one additional resistive element coupled in parallel with the first resistive element between the second source/drain region of the second n-channel field-effect transistor and the sixth potential node; and
- at least one additional n-channel field-effect transistor, each additional n-channel field-effect transistor coupled between one of the additional resistive elements and the sixth potential node and each additional field-effect transistor having a gate coupled to receive a separate control signal different from the first control signal.

26. The sensing device of claim 1, wherein the reference current is less than one-half an expected current flow through the floating-gate memory cell in an erased state.

27. The sensing device of claim 1, wherein the reference current is approximately one order of magnitude less than an expected current flow through the floating-gate memory cell in an erased state.

28. The sensing device of claim 1, wherein a pass transistor is coupled between the floating-gate memory cell and the input node of the sensing device, wherein a gate of the pass transistor is coupled to receive a control signal, and wherein signal noise is suppressed on the control signal received by the gate of the pass transistor during at least a portion of a sensing operation.

29. The sensing device of claim 1, wherein the precharging path couples the precharge potential to the input of the sensing device for a period of time, and wherein the period of time is controlled by a timing pulse generated by a pulse generator having compensation for both supply voltage and ambient temperature.

30. A sensing device for sensing a programmed state of a floating-gate memory cell, wherein the sensing device has an input node selectively coupled to the floating-gate memory cell, the sensing device comprising:
- a precharging path coupled between a first potential node and the input node of the sensing device, wherein the first potential node is coupled to receive a precharge potential;
- a reference current path having a field-effect transistor coupled between a second potential node and the input node of the sensing device, the field-effect transistor having a gate coupled to receive a reference current control signal, wherein the second potential node is coupled to receive a second potential for providing a reference current to the input node of the sensing device; and
- a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device;
- wherein the third potential node is coupled to receive a third potential; and
- wherein the fourth potential node is coupled to receive a fourth potential.

31. A sensing device for sensing a programmed state of a floating-gate memory cell, wherein the sensing device has an input node selectively coupled to the floating-gate memory cell, the sensing device comprising:
- a precharging path coupled between a first potential node and the input node of the sensing device, wherein the first potential node is coupled to receive a precharge potential;
- a reference current path having a p-channel field-effect transistor coupled between a second potential node and the input node of the sensing device, the p-channel field-effect transistor having a gate coupled to receive a reference current control signal, wherein the second potential node is coupled to receive a second potential for providing a reference current to the input node of the sensing device;
- a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device, wherein the third potential node is coupled to receive a third potential and the fourth potential node is coupled to receive a fourth potential; and
- a reference current control signal generator having a diode coupled between a fifth potential node and the gate of the p-channel field-effect transistor of the reference current path, the reference current control signal generator further having a resistive component coupled between a sixth potential node and the output node of the reference current control signal generator, wherein the fifth potential node is coupled to receive a fifth potential and the sixth potential node is coupled to receive a sixth potential.

32. A sensing device for sensing a programmed state of a floating-gate memory cell, wherein the sensing device has an input node selectively coupled to the floating-gate memory cell, the sensing device comprising:
- a precharging path coupled between a first potential node and the input node of the sensing device, wherein the first potential node is coupled to receive a precharge potential;
- a reference current path having a p-channel field-effect transistor coupled between a second potential node and the input node of the sensing device, the p-channel field-effect transistor having a gate coupled to receive a reference current control signal, wherein the second potential node is coupled to receive a second potential for providing a reference current to the input node of the sensing device;
- a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device, wherein the third potential node is coupled to receive a third potential and the fourth potential node is coupled to receive a fourth potential; and
- a reference current control signal generator having an output node coupled to the gate of the p-channel field-effect transistor of the reference current path for providing the reference current control signal, the reference current control signal generator comprising:

a plurality of diode-connected p-channel field-effect transistors, each diode-connected p-channel field-effect transistor having a first source/drain region coupled to receive a fifth potential from a fifth potential node, a second source/drain region coupled to the output node of the reference current control signal generator, and a gate coupled to output node of the reference current control signal generator, wherein each p-channel field-effect transistor of the plurality of diode-connected p-channel field-effect transistors is sized to be substantially identical to the p-channel field-effect transistor of the reference current path;

a first n-channel field-effect transistor having a first source/drain region coupled to the output node of the reference current control signal generator, a second source/drain region, and a gate coupled to receive a first control signal, wherein the first n-channel field-effect transistor is sized to be substantially identical to a first pass transistor coupled between the floating-gate memory cell and the sensing device;

a second n-channel field-effect transistor having a first source/drain region coupled to the second source/drain region of the first field-effect transistor, a second source/drain region, and a gate coupled to receive the first control signal, wherein the second n-channel field-effect transistor is sized to be substantially identical to a second pass transistor coupled between the floating-gate memory cell and the sensing device; and a resistive component having an input coupled to the second source/drain region of the second field-effect transistor and an output coupled to receive a sixth potential from a sixth potential node, the resistive component including a first resistive element coupled between the second source/drain region of the second field-effect transistor and the sixth potential node and a third n-channel field-effect transistor coupled between the first resistive element and the sixth potential node, the third n-channel field effect transistor having a gate coupled to receive the first control signal;

wherein the third potential and the fifth potential are the same potential and that potential is a supply potential; and wherein the fourth potential and the sixth potential are the same potential and that potential is a ground potential.

33. A flash memory device, comprising:
an array of floating-gate memory cells; and
a single-ended sensing device for sensing a programmed state of a floating-gate memory cell of the array of floating-gate memory cells, wherein the sensing device has an input node selectively coupled to a floating-gate memory cell of the array of floating-gate memory cells, the sensing device further comprising:

a precharging path coupled between a first potential node and the input node of the sensing device, wherein the first potential node is coupled to receive a precharge potential;

a reference current path coupled between a second potential node and the input node of the sensing device, wherein the second potential node is coupled to receive a second potential for providing a reference current to the input node of the sensing device; and a sense inverter having an input coupled to the input node of the sensing device and an output for providing an output signal responsive to a potential level of the input node of the sensing device relative to a threshold point, wherein the output signal is indicative of the programmed state of the floating-gate memory cell.

34. A flash memory device, comprising:
an array of floating-gate memory cells; and
a single-ended sensing device for sensing a programmed state of a floating-gate memory cell of the array of floating-gate memory cells, wherein the sensing device has an input node selectively coupled to a floating-gate memory cell of the array of floating-gate memory cells, the sensing device further comprising:

a precharging path coupled between a first potential node and the input node of the sensing device, wherein the first potential node is coupled to receive a precharge potential;

a reference current path having a field-effect transistor coupled between a second potential node and the input node of the sensing device, the field-effect transistor having a gate coupled to receive a reference current control signal, wherein the second potential node is coupled to receive a second potential for providing a reference current to the input node of the sensing device; and a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device;

wherein the third potential node is coupled to receive a third potential; and wherein the fourth potential node is coupled to receive a fourth potential.

35. A flash memory device, comprising:
an array of floating-gate memory cells; and
a single-ended sensing device for sensing a programmed state of a floating-gate memory cell of the array of floating-gate memory cells, wherein the sensing device has an input node selectively coupled to a floating-gate memory cell of the array of floating-gate memory cells, the sensing device further comprising:

a precharging path coupled between a first potential node and the input node of the sensing device, wherein the first potential node is coupled to receive a precharge potential;

a reference current path having a p-channel field-effect transistor coupled between a second potential node and the input node of the sensing device, the p-channel field-effect transistor having a gate coupled to receive a reference current control signal, wherein the second potential node is coupled to receive a second potential for providing a reference current to the input node of the sensing device;

a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device, wherein the third potential node is coupled to receive a third potential and the fourth potential node is coupled to receive a fourth potential; and a reference current control signal generator having a diode coupled between a fifth potential node and the gate of the p-channel field-effect transistor of the reference current path, the reference current control signal generator further having a resistive component coupled between a sixth potential node and the output node of the reference current control signal generator, wherein the fifth potential node is coupled to receive a fifth potential and the sixth potential node is coupled to receive a sixth potential.

36. An electronic system, comprising:

a processor; and a memory device coupled to the processor, wherein the memory device has an array of floating-gate memory cells and a single-ended sensing device for sensing a programmed state of a floating-gate memory cell of the array of floating-gate memory cells, wherein the sensing device has an input node selectively coupled to a floating-gate memory cell of the array of floating-gate memory cells and further comprises:

a precharging path coupled between a first potential node and the input node of the sensing device, wherein the first potential node is coupled to receive a precharge potential;

a reference current path coupled between a second potential node and the input node of the sensing device, wherein the second potential node is coupled to receive a second potential for providing a reference current to the input node of the sensing device; and a sense inverter having an input coupled to the input node of the sensing device and an output for providing an output signal responsive to a potential level of the input node of the sensing device relative to a threshold point, wherein the output signal is indicative of the programmed state of the floating-gate memory cell.

37. The electronic system of claim 36, wherein the electronic system is selected from the group consisting of a computer, a peripheral device, a digital cellular device, a digital wireless device, a digital camera, an audio recorder and a personal digital assistant.

38. An electronic system, comprising:

a processor; and a memory device coupled to the processor, wherein the memory device has an array of floating-gate memory cells and a single-ended sensing device for sensing a programmed state of a floating-gate memory cell of the array of floating-gate memory cells, wherein the sensing device has an input node selectively coupled to a floating-gate memory cell of the array of floating-gate memory cells and further comprises:

a precharging path coupled between a first potential node and the input node of the sensing device, wherein the first potential node is coupled to receive a precharge potential;

a reference current path having a field-effect transistor coupled between a second potential node and the input node of the sensing device, the field-effect transistor having a gate coupled to receive a reference current control signal, wherein the second potential node is coupled to receive a second potential for providing a reference current to the input node of the sensing device; and a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device;

wherein the third potential node is coupled to receive a third potential; and wherein the fourth potential node is coupled to receive a fourth potential.

39. An electronic system, comprising:

a processor; and a memory device coupled to the processor, wherein the memory device has an array of floating-gate memory cells and a single-ended sensing device for sensing a programmed state of a floating-gate memory cell of the array of floating-gate memory cells, wherein the sensing device has an input node selectively coupled to a floating-gate memory cell of the array of floating-gate memory cells and further comprises:

a precharging path coupled between a first potential node and the input node of the sensing device, wherein the first potential node is coupled to receive a precharge potential;

a reference current path having a p-channel field-effect transistor coupled between a second potential node and the input node of the sensing device, the p-channel field-effect transistor having a gate coupled to receive a reference current control signal, wherein the second potential node is coupled to receive a second potential for providing a reference current to the input node of the sensing device;

a sense inverter having a p-channel stage coupled between a third potential node and an output of the sense inverter, the p-channel stage comprising at least one p-channel field-effect transistor each having a gate coupled to the input node of the sensing device, the sense inverter further having an n-channel stage coupled between a fourth potential node and the output of the sense inverter, the n-channel stage comprising at least one n-channel field-effect transistor each having a gate coupled to the input node of the sensing device, wherein the third potential node is coupled to receive a third potential and the fourth potential node is coupled to receive a fourth potential; and a reference current control signal generator having a diode coupled between a fifth potential node and the gate of the p-channel field-effect transistor of the reference current path, the reference current control signal generator further having a resistive component coupled between a sixth potential node and the output node of the reference current control signal generator, wherein the fifth potential node is coupled to receive a fifth potential and the sixth potential node is coupled to receive a sixth potential.

* * * * *

UNITED STATES PATENT AND TRADEMARK OFFICE
CERTIFICATE OF CORRECTION

PATENT NO. : 6,687,161 B2
DATED : February 3, 2004
INVENTOR(S) : Marotta et al.

It is certified that error appears in the above-identified patent and that said Letters Patent is hereby corrected as shown below:

<u>Title page</u>,
Item [30], Foreign Application Priority Data, replace "RM2001A001" with
-- RM2001A000001 --

Signed and Sealed this

Fourteenth Day of September, 2004

JON W. DUDAS
*Director of the United States Patent and Trademark Office*